US009306518B2

(12) United States Patent
Pan

(10) Patent No.: US 9,306,518 B2
(45) Date of Patent: *Apr. 5, 2016

(54) VOLTAGE REGULATORS, AMPLIFIERS, MEMORY DEVICES AND METHODS

(71) Applicant: MICRON TECHNOLOGY, INC., Boise, ID (US)

(72) Inventor: Dong Pan, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 14/287,381

(22) Filed: May 27, 2014

(65) Prior Publication Data

US 2014/0266447 A1 Sep. 18, 2014

Related U.S. Application Data

(63) Continuation of application No. 13/570,913, filed on Aug. 9, 2012, now Pat. No. 8,737,154, which is a continuation of application No. 12/749,281, filed on Mar. 29, 2010, now Pat. No. 8,248,880.

(51) Int. Cl.
*G11C 5/14* (2006.01)
*H03F 3/45* (2006.01)
*G11C 7/12* (2006.01)
(Continued)

(52) U.S. Cl.
CPC ............ *H03F 3/45071* (2013.01); *G11C 5/147* (2013.01); *G11C 7/06* (2013.01); *G11C 7/065* (2013.01); *G11C 7/12* (2013.01); *G11C 11/4091* (2013.01); *G11C 11/4097* (2013.01);
(Continued)

(58) Field of Classification Search
CPC .......... G11C 5/147; G11C 5/14; G11C 5/143; G11C 11/4074; G11C 11/4091; G11C 11/4097; G11C 7/065; G11C 7/06; G11C 7/12
USPC ........ 365/226, 189.07, 189.09, 205, 206, 207
See application file for complete search history.

(56) References Cited

U.S. PATENT DOCUMENTS 6,456,556 B1 * 9/2002 Huber .................... G11C 5/147
365/189.11
6,456,557 B1 * 9/2002 Dadashev .............. G11C 5/147
365/185.09

(Continued)

OTHER PUBLICATIONS

Falin, Jeff "ESR, Stability, and the LDO Regulator", Texas Instruments, Application Report SLVA115, May 2002, 1-5.

*Primary Examiner* — Pho M Luu
(74) *Attorney, Agent, or Firm* — Dorsey & Whitney LLP

(57) ABSTRACT

Circuits, devices and methods are provided, such as an amplifier (e.g., a voltage regulator) that includes a feedback circuit that supplies negative feedback through a feedback path. One such feedback path includes a capacitance coupled in series with a "one-way" isolation circuit through which a feedback signal is coupled. The "one-way" isolation circuit my allow the feedback signal to be coupled from a "downstream" node, such as an output node, to an "upstream" node, such as a node at which an error signal is generated to provide negative feedback. However, the "one-way" isolation circuit may substantially prevent variations in the voltage at the upstream node from being coupled to the capacitance in the isolation circuit. As a result, the voltage at the upstream node may quickly change since charging and discharging of the capacitance responsive to voltage variations at the upstream node may be avoided.

20 Claims, 5 Drawing Sheets

(51) Int. Cl.
*G11C 7/06* (2006.01)
*G11C 11/4091* (2006.01)
*G11C 11/4097* (2006.01)

(52) U.S. Cl.
CPC .. *H03F3/45183* (2013.01); *H03F 2003/45008* (2013.01); *H03F 2203/45264* (2013.01)

(56) References Cited

U.S. PATENT DOCUMENTS

| | | | |
|---|---|---|---|
| 6,628,558 B2 * | 9/2003 | Fiscus | G11C 5/147 327/512 |
| 6,947,328 B1 | 9/2005 | Smidt et al. | |
| 7,206,243 B2 * | 4/2007 | Lovett | G11C 11/404 365/189.04 |
| 7,432,758 B2 | 10/2008 | Chou et al. | |
| 7,577,043 B2 | 8/2009 | Chou et al. | |
| 8,248,880 B2 * | 8/2012 | Pan | H03F 3/45183 365/189.07 |
| 8,737,154 B2 * | 5/2014 | Pan | H03F 3/45183 365/189.07 |
| 2011/0235455 A1 | 9/2011 | Pan | |
| 2012/0299655 A1 | 11/2012 | Pan | |

\* cited by examiner

VOLTAGE REGULATORS, AMPLIFIERS, MEMORY DEVICES AND METHODS

CROSS-REFERENCE TO RELATED APPLICATIONS

This application is a continuation of U.S. patent application Ser. No. 13/570,913, filed Aug. 9, 2012, and issued as U.S. Pat. No. 8,737,154 on May 27, 2014, which is a continuation of U.S. patent application Ser. No. 12/749,281, filed Mar. 29, 2010, and issued as U.S. Pat. No. 8,248,880 on Aug. 21, 2012. The aforementioned applications and patents are incorporated herein by reference, in their entirety, for any purpose.

TECHNICAL HELD

Embodiments of this invention relate to voltage regulators, amplifiers, memory devices and methods of regulating voltage and amplifying a signal.

BACKGROUND

It is frequently necessary to provide (e.g., supply, generate, output, etc.) regulated voltages to electronic circuits for a variety of reasons. For example, electronic circuits normally receive a supply voltage that may be used to supply power to the circuit. The supply voltage may be supplied by a voltage regulator, which is typically designed to supply a voltage that is relatively constant during operation of the electronic circuit. The supply voltage may suddenly change, for example, if the load driven by a voltage regulator suddenly changes for reasons such as a sudden change in the magnitude of the load on the voltage regulator. The voltage supplied by a voltage regulator may also be used for other purposes, such as to provide a reference voltage to a circuit. Thus, even if the magnitude of the power supply voltage provided by a voltage regulator may not be critical, it may be desirable for the voltage regulator to provide a tightly regulated voltage if the voltage regulator also supplies a reference voltage.

One commonly used voltage regulator may use negative feedback to regulate a voltage provided by the regulator. More specifically, a feedback signal may provide an indication of the magnitude of an output voltage from the regulator, which may be compared to a reference voltage to provide an error signal. The error signal may be amplified to provide a signal that may be used to drive the output voltage back to a level that causes the feedback voltage to be substantially equal to the reference voltage.

The loop gain of a voltage regulator should be fairly high to tightly control the voltage output from the voltage regulator. Unfortunately, the use of a high loop gain in a negative feedback voltage regulator may make the regulator unstable, thereby causing the output of the regulator to oscillate. Frequency compensation circuits may be provided to prevent instability. One common frequency compensation circuit uses a series combination of a capacitor and a small resistor coupled between an output node from which a regulated voltage is provided and a node of the circuit to which the amplified error signal is provided. While this compensation circuit may be effective in avoiding instability, it requires that the amplified error signal charge or discharge the capacitor in order to drive the regulated voltage back to a specific value. As a result, the speed at which voltage regulator circuits using this type of frequency compensation circuit may correct for a sudden increase or decrease in the load on the voltage regulator may be severely limited.

In the context of this application, a voltage regulator may be considered an amplifier, wherein the input signal to the amplifier in such a case is a reference voltage. It would therefore be desirable to provide a voltage regulator, amplifier and method having a loop gain sufficiently high to generate an output signal (e.g., output voltage) that closely followed an input signal (e.g., a reference voltage) without resulting in instability problems or response time limitations.

DETAILED DESCRIPTION

Figure 1:
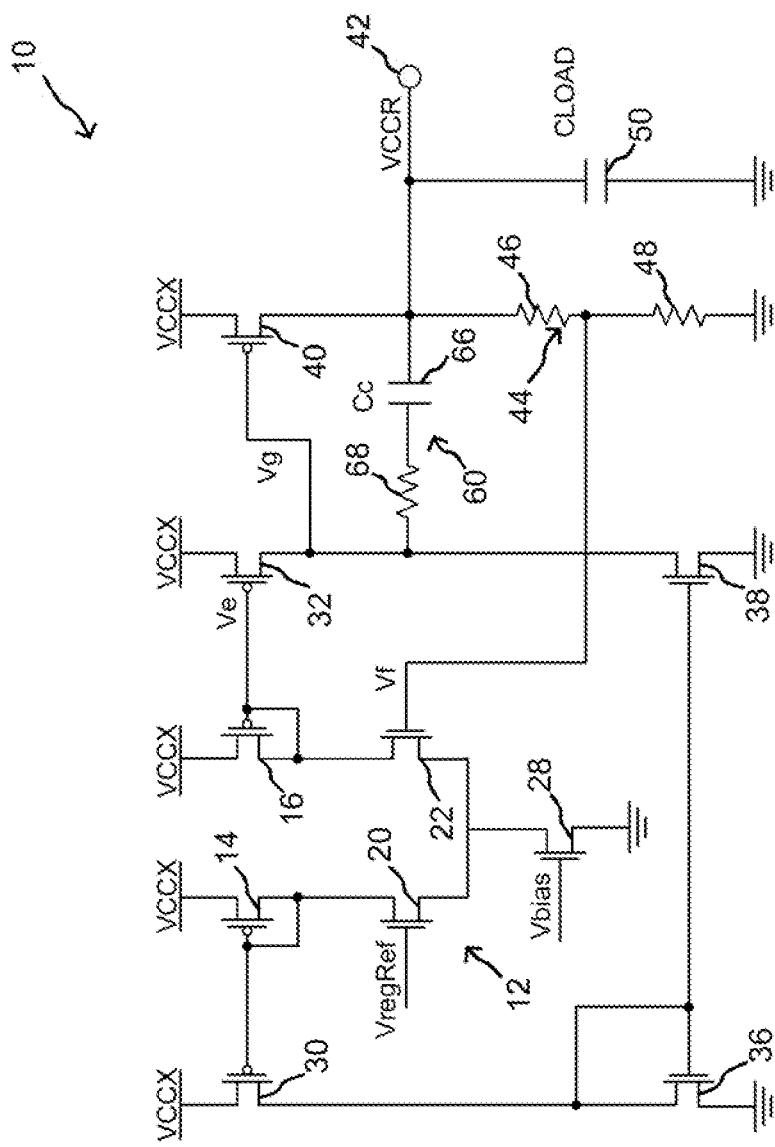
FIG. 1 is a schematic diagram of a prior art voltage regulator using a conventional voltage compensation circuit.

A prior art voltage regulator 10 is shown in FIG. 1. The voltage regulator 10 includes a differential amplifier 12 formed by two PMOS load transistors 14, 16, two NMOS input transistors 20, 22 and a bias transistor 28, which controls the bias current flowing through the combination of a first branch formed by the transistors 14, 20 and a second branch formed by the transistors 16, 22. For this purpose, the bias transistor 28 receives a bias voltage Vbias. The gate of one of the input transistors 20 receives a reference voltage vregRef, and the gate of the other input transistor 22 receives a feedback voltage Vf. The PMOS load transistor 14 may be diode-coupled, and it may be connected to the gate of a PMOS transistor 30 in mirrored configuration. Likewise, the PMOS load transistor 16 may be diode-coupled and connected to the gate of a PMOS transistor 32 in mirrored configuration. The PMOS transistor 30 may be coupled in series with an NMOS transistor 36 between a supply voltage VCCX and a reference voltage, such as ground, and the PMOS transistor 32 may be coupled in series with an NMOS transistor 38 between the supply voltage VCCX and the reference voltage. The NMOS transistor 36 may be coupled to the NMOS transistor 38 in mirrored configuration.

In operation, the differential amplifier 12 may provide an error voltage Ve at the drains of the transistors 16, 22 that varies with the difference between the magnitude of the reference voltage and the magnitude of the feedback voltage Vf. When the feedback voltage Vf is greater than the reference voltage VregRef, the error voltage Ve is reduced, and, when the feedback voltage Vf is less than the reference voltage VregRef, the error voltage Ve is increased. Because of the gain of the differential amplifier 12, the magnitude of the changes in the error voltage Ve may be substantially greater than the magnitude of the resulting changes in the feedback voltage Vf.

The transistor 32 may invert and amplify the error voltage Ve to provide an amplified error voltage Vg. The amplified error voltage Vg may be coupled to the gate of a PMOS output transistor 40, which may have its drain coupled to an output node 42 to provide a regulated voltage VCCR. The regulated voltage VCCR may be coupled to a voltage divider 44 formed by a pair of resistors 46, 48, which may provide the feedback voltage Vf. Finally, the regulated voltage VCCR at the output node 42 may be applied to a capacitor 50 to provide low-pass filtering.

The above-described components of the voltage regulator 10 thus constitute an amplifying circuit that generates a signal at a "downstream" node, such as the output node 42, and an upstream node, such as the gate of the input transistor 22, between which a feedback signal is coupled. In operation, a decrease in the regulated voltage VCCR, such as a might be caused by a sudden increase in a load driven by the voltage regulator 10, causes a proportional decrease in the magnitude of the feedback voltage Vf. The reduced feedback voltage Vf applied to the gate of the input transistor 22 may cause an increase in the magnitude of the error voltage Ve, as previously explained. The increase in the magnitude of the error voltage Ve applied to the gate of the PMOS transistor 32 may decrease the voltage Vg applied to the gate of the output transistor 40. As a result, the output transistor 40 may increase the magnitude of the regulated voltage VCCR back to a voltage that increases the magnitude of the feedback voltage Vf closer to the magnitude of the reference voltage VregRef. An increase in the magnitude of the regulated voltage VCCR, such as by a decrease in the load driven by the voltage regulator 10, may similarly cause the magnitude of the regulated voltage VCCR to be decreased back to a voltage that again causes the magnitude of the feedback voltage Vf to be closer to the magnitude of the reference voltage VregRef. The feedback voltage Vf may thus provides negative feedback that causes the magnitude of the regulated voltage VCCR to remain relatively constant as the load of the voltage regulator 10 varies.

As previously explained, the loop gain of the voltage regulator should be fairly large to minimize variations in the magnitude of the regulated voltage VCCR resulting from variations in the load driven by the voltage regulator. As also previously mentioned, the use of high loop gain in a negative feedback voltage regulator may make the voltage regulator unstable. For this reason, a frequency compensation circuit 60 formed by the series combination of a capacitor 66 and a small resistor 68 might be used. The capacitor 66 and a resistor 68 may create a feedback path for coupling a feedback signal between a "downstream node," such as the output node 42, and an "upstream node," such as the gate of the output transistor 40. The compensation capacitor 66 may thus provide significant negative feedback at high frequencies to prevent oscillation. However, the use of high gain negative feedback to closely control the magnitude of the regulated voltage VCCR may imply that the gain of the voltage regulator 10 will be high enough so that a small change in the magnitude of the regulated voltage VCCR causes a substantially greater change in the magnitude of the resulting voltage Vg applied to the gate of the output transistor 40. Unfortunately, changes in the magnitude of the voltage Vg at the gate of the output transistor 40 may require that the capacitor 66 in the frequency compensation circuit 60 be charged or discharged accordingly. Yet it may require a relatively large amount of time to charge or discharge the capacitor 66 in order to control the magnitude of the regulated voltage VCCR. Thus, the voltage regulator 10 may be relatively slow to respond to variation in the load on the regulator 10, thereby allowing the regulated voltage VCCR to differ substantially from a particular value. These voltage deviations may adversely affect the performance of electronic devices, such as memory devices, that are supplied with the regulated voltage VCCR.

Figure 2:
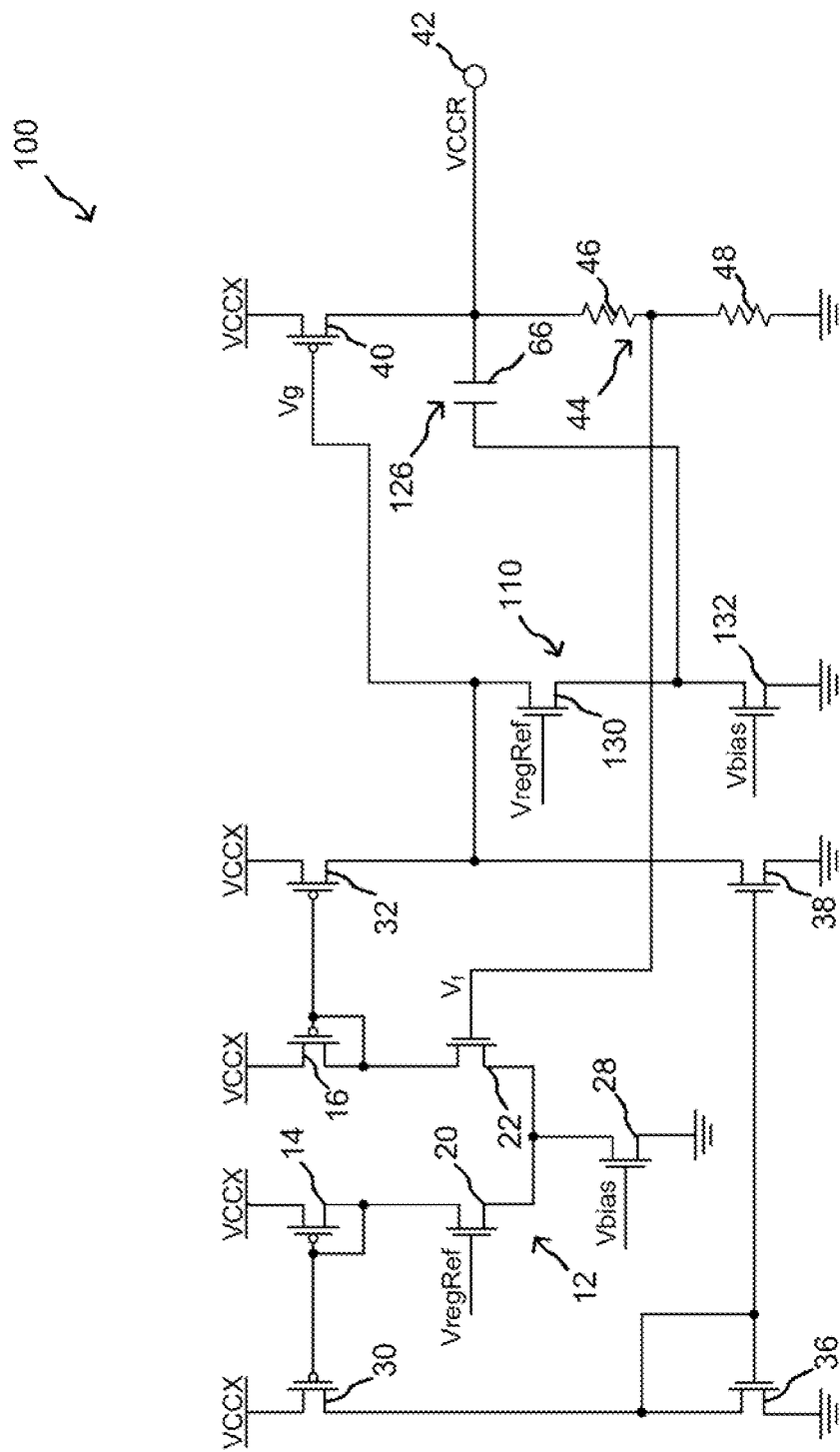
FIG. 2 is a schematic diagram of an embodiment of a voltage regulator.

An embodiment of a voltage regulator 100 that may provide good voltage regulation without the limitations of the regulator 10 shown in FIG. 1 is shown in FIG. 2. The voltage regulator 100 may use many of the same components that are used in the voltage regulator 10, and it may operate in substantially the same manner as the voltage regulator 10. Therefore, in the interest of brevity, these common components have been provided with the same reference numerals, and an explanation of their operation will not be repeated. The voltage regulator 100 differs from the voltage regulator 10 by decoupling the capacitor 66 from the gate of the output transistor 40 using an isolation circuit 110.

With further reference to FIG. 2, the isolation circuit 110 functions to isolate the capacitor 66 used as a frequency compensation circuit 126 from the changes in the voltage Vg at the gate of the output transistor 40 while coupling variations in the reference voltage VCCR to the gate of the output transistor 40 to provide negative, high-frequency feedback. Thus, the isolation circuit 110 may provide "one-way" isolation in that it may provide isolation in the direction from the gate of the output transistor 40 to the output node 42 without providing isolation in the direction from the output node 42 to the gate of the output transistor 40.

In one embodiment, the isolation circuit 110 includes two NMOS transistors 130, 132 coupled in series with each other between the gate of the output transistor 40 and ground. The gate of the upper transistor 130 receives a reference voltage, which may be the reference voltage VregRef applied to the gate of the input transistor 20, and the gate of the lower transistor 132 receives a bias voltage, which may be the bias voltage Vbias applied to the gate of the bias transistor 28. The bias voltage Vbias may function to set the magnitude of the current flow through the transistor 130. Insofar as the voltage applied to the gate of the output transistor 40 will normally be greater than the reference voltage VregRef, the source of the transistor 130 may be maintained at the reference voltage VregRef less a threshold voltage Vt of the transistor 130.

In operation, any change in the voltage Vg applied to the gate of the output transistor 40 will not be coupled to the source of the transistor 130 since the voltage at the source of the transistor 130 will be maintained at VregRef-Vt. Thus, the capacitor 66 will not be charged or discharged responsive to variations in voltage Vg applied to the gate of the output transistor 40. As a result, the voltage Vg at the gate of the output transistor 40 can change without charging or discharging the capacitor 66 to provide a relatively fast response time. On the other hand, relatively high frequency variations in the regulated voltage VCCR may be coupled through the capacitor 66 to the source of the transistor 130 since these voltage variations may vary the gate to source voltage of the transistor 130 insofar as the gate of the transistor 130 may be maintained at VregRef. As a result, higher-frequency variations in the regulated voltage VCCR may be coupled to the gate of the output transistor 40 to provide high-frequency negative feedback. Thus, by allowing only "one-way" feedback, the isolation circuit 110 may provide frequency compensation without decreasing the response time of the voltage regulator 100.

Figure 3:
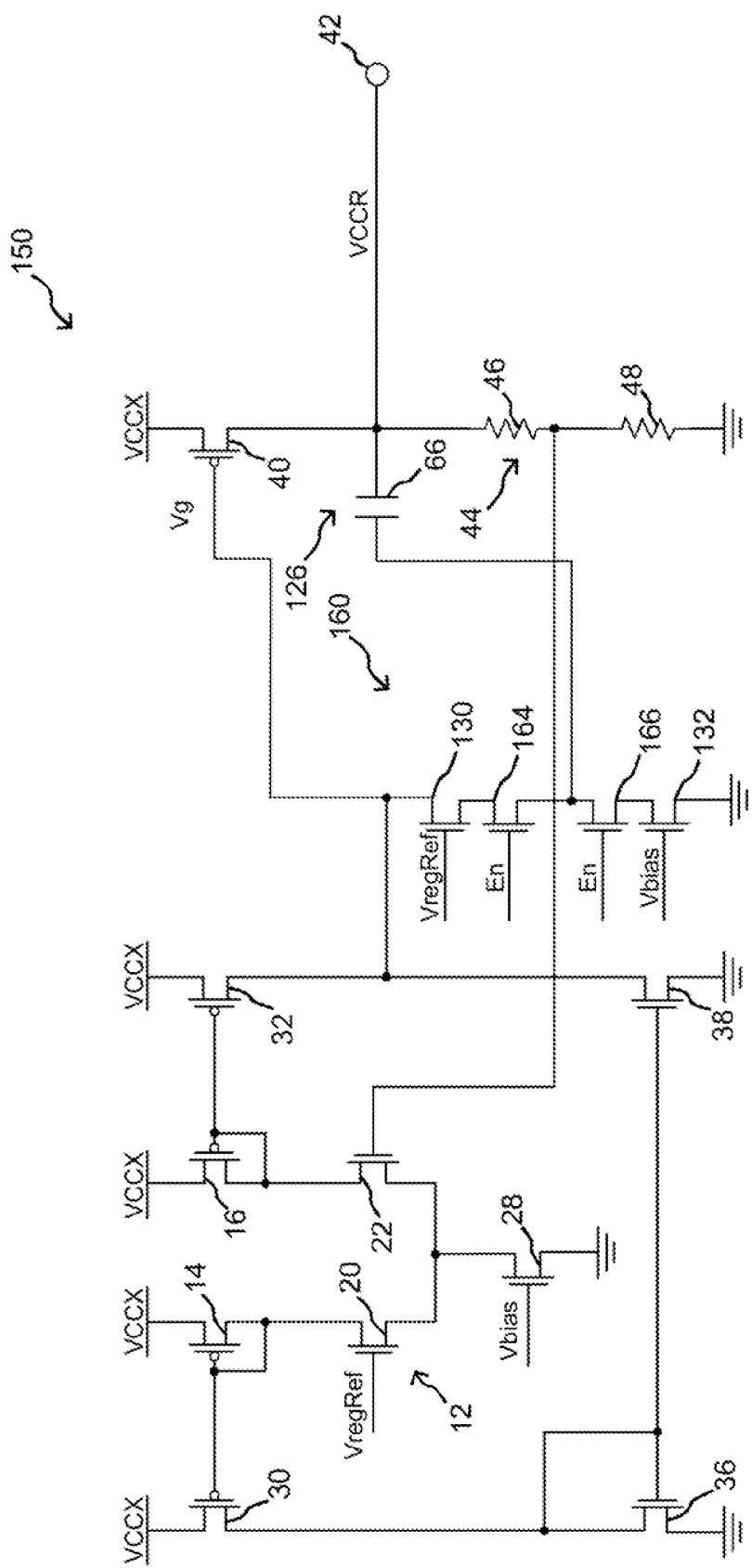
FIG. 3 is a schematic diagram of another embodiment of a voltage regulator.

Another embodiment of a voltage regulator 150 is shown in FIG. 3. Again, the components of the voltage regulator 150 that are common to the components in the voltage regulator 10 have been provided with the same reference numerals, and an explanation of their operation will not be repeated. The voltage regulator 150 differs from the voltage regulator 100 by using an isolation circuit 160 that may be selectively enabled. Specifically, the isolation circuit 160 includes an NMOS transistors 164 coupled between the transistor 130 and the capacitor 66 and an NMOS transistor 166 coupled between the capacitor 66 and the transistor 132. The gates of the transistors 164, 166 each coupled to receive an enable EN signal. When the EN signal is high, the transistors 164, 166 may couple the transistors 130, 132 to the capacitor 66 to provide high-frequency negative feedback without unduly decreasing the response time of the circuit, as explained above. When the EN signal is low, the transistors 164, 166 may isolate the transistors 130, 132 from the capacitor 66 to disable the negative feedback.

One potential limitation of the isolation circuit 160 shown in FIG. 3 is that the circuit 160 may not provide optimum performance when it is initially enabled since it may be necessary for the capacitor 66 to be either charged through the transistors 130, 164 or discharged through the transistors 132, 166. Until the voltage on the capacitor 66 has reached a voltage of VregRef-Vt, the isolation circuit 160 may either not provide negative feedback or allow the response time of the voltage regulator 150 to be limited by the need to charge or discharge the capacitor 66. More specifically, if the capacitor 66 has discharged to a voltage less that VregRef-Vt when the isolation circuit 160 is enabled, the capacitor 66 will be charged through the transistors 130, 164. During this time, the rate at which the voltage at the gate of the output transistor 40 can change may be limited by the need to charge the capacitor 66, thereby limiting the response time of the voltage regulator 150. On the other hand, if the capacitor 66 is somehow charged to a voltage that is significantly greater than VregRef-Vt, the transistor 130 will remain non-conductive regardless of variations in the voltage coupled to the source of the transistor 130 from the output node 42, so that no negative high-frequency feedback may be coupled to the gate of the output transistor 40.

Figure 4:
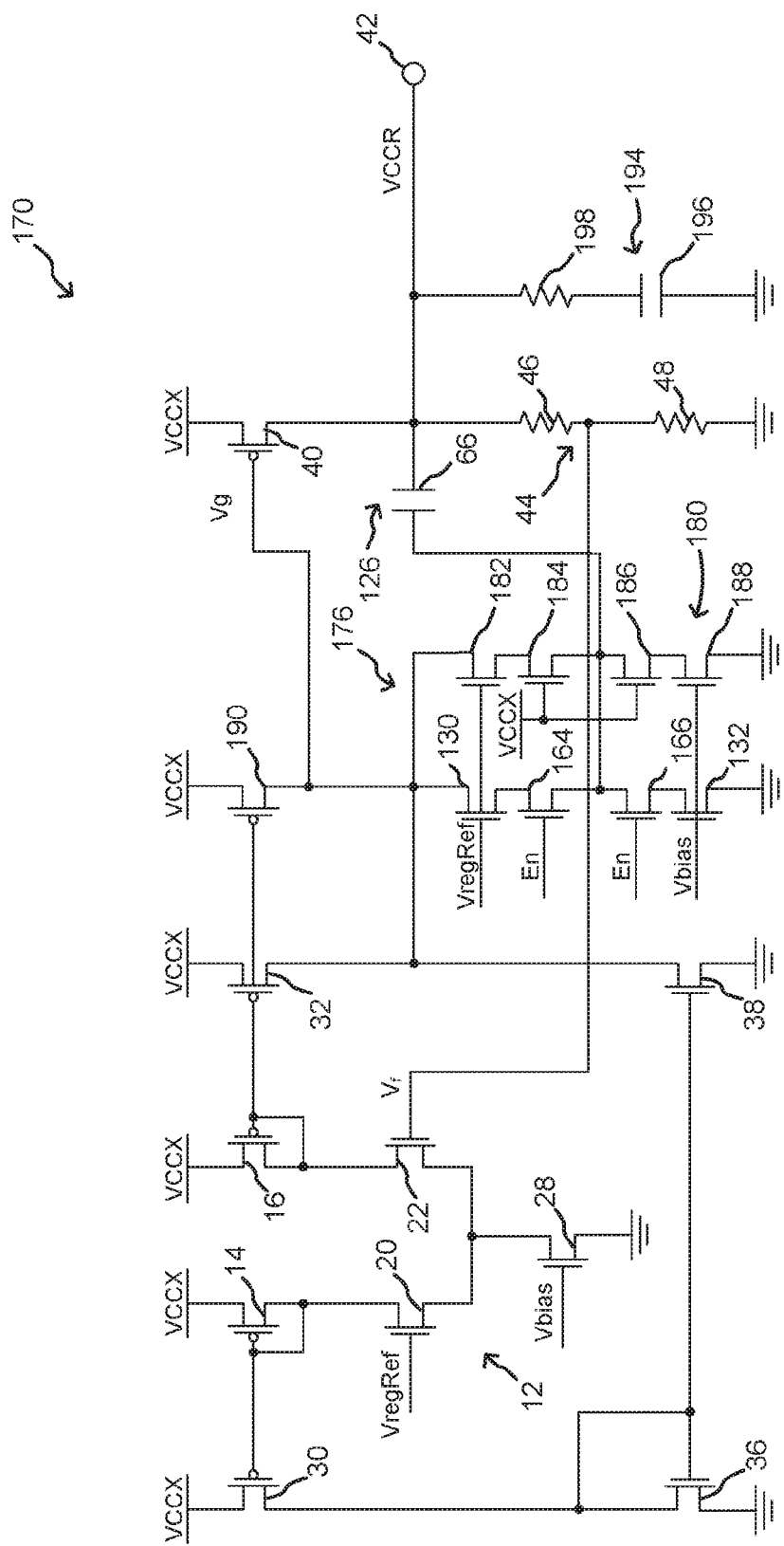
FIG. 4 is a schematic diagram of another embodiment of a voltage regulator.

Another embodiment of a voltage regulator 170 that may avoid the potential limitation of the voltage regulator 150 described above is shown in FIG. 4. The voltage regulator 170 uses an isolation circuit 176 that includes a charge maintaining circuit 180. Except for the charge maintaining circuit 180 and an extra PMOS transistor 190, the isolation circuit 176 may use the same components that are used in the isolation circuit 160 of FIG. 3 operating in the same manner. Therefore, these common components have been provided with the same reference numerals, and an explanation of their operation will not be repeated. The charge maintaining circuit 180 used in the isolation circuit 176 includes a first pair of NMOS transistors 182, 184 coupled between the gate of the output transistors 40 and the capacitor 66. The gate of the transistor 182 may be coupled to receive the reference voltage VregRef, and the gate of the transistor 184 may be coupled to receive a voltage, such as the supply voltage VCCX, that biases the transistor 184 to a conductive state. The charge maintaining circuit 180 may also include a second pair of NMOS transistors 186, 188 coupled between the capacitor 66 and ground. The gate of the transistor 186 may be coupled to receive a voltage, such as VCCX, that biases the transistor 186 to a conductive state, and the gate of the transistor 188 may be coupled to receive the bias voltage Vbias. One or both of the transistors 182, 184 may have a channel width/length ratio that is smaller than the smallest channel width/length ratio of the transistors 130, 164 so that the impedance through the transistors 182, 184 is significantly higher than the impedance through the transistors 130, 164. Similarly, one or both of the transistors 186, 188 may have a channel width/length ratio that is smaller than the smallest channel width/length ratio of the transistors 132, 166 so that the impedance through the transistors 186, 188 is significantly higher than the impedance through the transistors 132, 166. As a result, when the transistors 164, 166 are not enabled, the impedance from the capacitor 66 to the gate of the output transistor 40 and from the capacitor 66 to ground may be high enough that little if any high-frequency negative feedback is provided by the capacitor 66. However, the charge maintaining circuit 180 may apply a voltage to the capacitor 66 in the same manner as when the transistors 164, 166 are enabled, thereby maintaining the capacitor 66 in the same charged condition it is in when the transistors 164, 166 are enabled. As a result, the isolation circuit 176 may allow the capacitor to provide negative feedback without limiting the response time of the voltage regulator 170 as soon as the transistors 164, 166 are enabled. As further shown in FIG. 4 and as mentioned above, the charge maintaining circuit 180 may include an additional PMOS transistor 190 coupled in parallel with the transistor 32 to supply additional current to the isolation circuit 176.

A stabilizing circuit 194 may be coupled between the output node 42 and ground, such as in embodiments where additional stability is needed or desired. The stabilizing circuit 194 may include a capacitor 196 coupled in series with a resistor 198 to provide the frequency response of the voltage regulator 170 with a left-hand plane zero. As is known in the art, a left-hand plane zero may gradually reduce the loop gain of the voltage regulator 170 at a frequency determined by the product of the capacitance of the capacitor 196 and the resistance of the resistor 198. At the same time, it may provide a leading phase shift to counteract the lagging phase shift of a right-hand plane pole created by the capacitor 66, thereby helping to avoid positive high-frequency feedback before the loop gain of the voltage regulator 170 has been attenuated to a gain of less than unity. In this manner, the stabilizing circuit 194 may further prevent oscillation from developing in the voltage regulator 170.

Although the various embodiments have been explained in the context of a voltage regulator, it will be understood that they may also be used in more general amplifier embodiments. In such case, an input signal would be applied to the input transistor 20 so that the voltage at the output node 42 corresponds to the input signal. Viewed in this context, a voltage regulator may be considered a subset of an amplifier in which the input signal is a constant reference voltage. Therefore, the foregoing descriptions of the various voltage regulator embodiments may also, more generally, apply to amplifiers.

Figure 5:
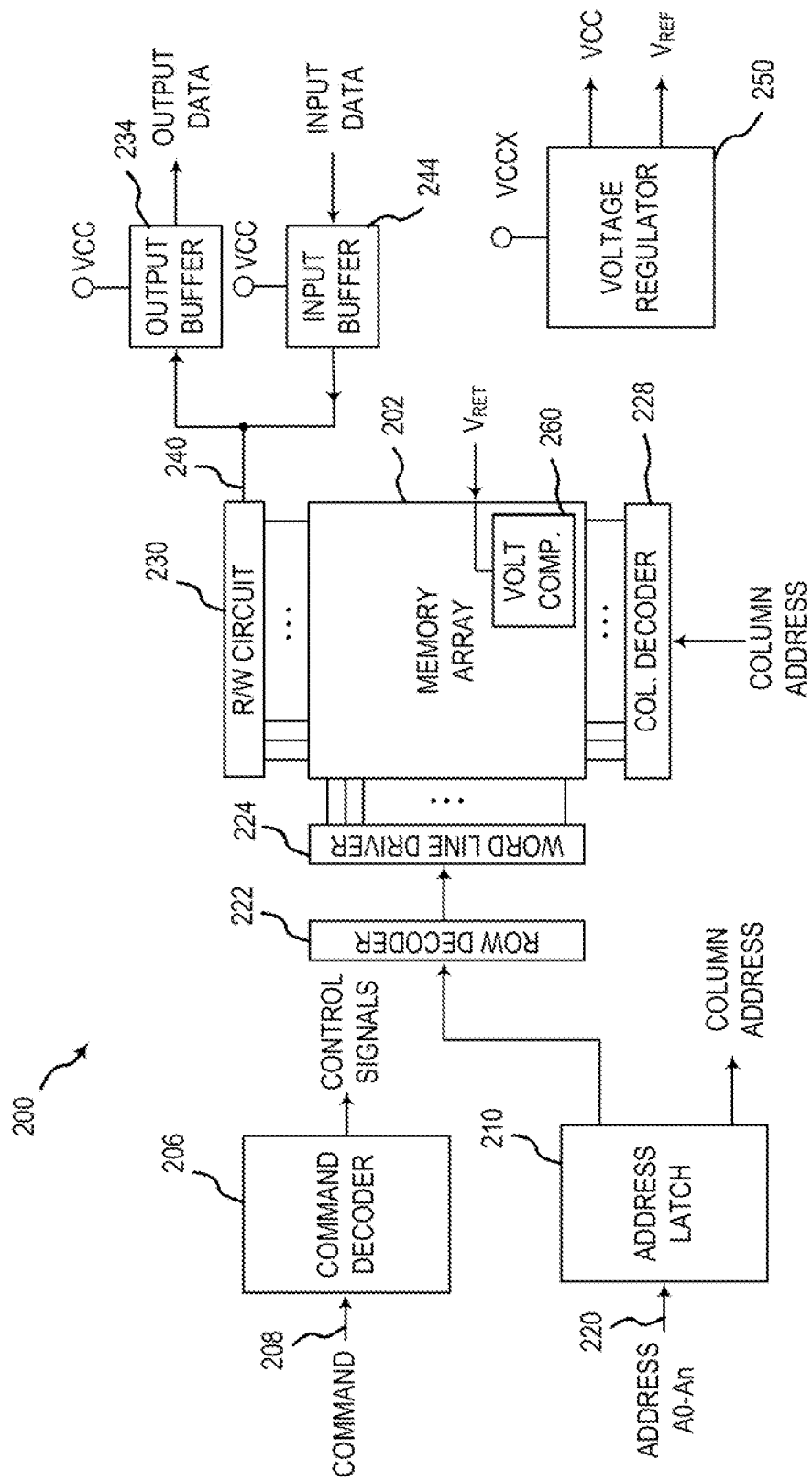
FIG. 5 is a block diagram of an embodiment of a memory device having a voltage regulator to supply the memory device with a regulated voltage.

As shown in FIG. 5, a memory device 200 may include an array 202 of memory cells, which may be, for example, DRAM memory cells, SRAM memory cells, flash memory cells, or some other types of memory cells. The memory system 200 includes a command decoder 206 that may receive memory commands through a command bus 208 and generate corresponding control signals within the memory system 200 to carry out various memory operations. Row and column address signals may be applied to an address latch 210 in the memory device 200 through an address bus 220. The address latch 210 may then output a separate column address and a separate row address.

The address latch 210 may provide row and column addresses to a row address decoder 222 and a column address decoder 228, respectively. The column address decoder 228 may select bit lines extending through the array 202 corresponding to respective column addresses. The row address decoder 222 may be connected to a word line driver 224 that activates respective rows of memory cells in the array 202 corresponding to received row addresses. The selected data line (e.g., a bit line or bit lines) corresponding to a received column address may be coupled to a read/write circuitry 230 to provide read data to a data output buffer 234 via an input-output data bus 240. Write data may be applied to the memory array 202 through a data input buffer 244 and the Memory array read/write circuitry 230. The command decoder 206 may respond to memory commands applied to the command bus 208 to perform various operations on the memory array 202. In particular, the command decoder 206 may be used to generate internal control signals to read data from and write data to the memory array 202.

With further reference to FIG. 5, the memory device 200 may use a voltage regulator 250 according to one of the embodiments described above or some other embodiment. The voltage regulator 250 may receive an unregulated supply voltage VCCX and provide a regulated supply voltage VCC to a power supply node of various components of the memory device described above, such as the output buffer 234 and the input buffer 244, for use in powering such components. In addition to or instead of supplying the regulated supply voltage VCC, the voltage regulator 250 may output a reference voltage Vref that may be used by some or all of the memory device components described below. More specifically, some or all of the memory device components described below, such as the memory array 202, may include a voltage comparison circuit 260 that is configured to compare a reference voltage to an internal voltage. In such case, the reference voltage Vref from the voltage regulator 250 may be applied to the voltage comparison circuit 260 for use as the reference voltage.

Although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited except as by the appended claims.

What is claimed is:

1. An apparatus, comprising:
a feedback path coupled between a downstream node of an amplifying circuit and an upstream node of the amplifying circuit; and
an isolation circuit included in the feedback path and configured to isolate variations in the upstream node from the downstream node.

2. The apparatus of claim 1, wherein the isolation circuit is configured to provide one-way isolation between the upstream and downstream nodes of the amplifying circuit.

3. The apparatus of claim 2, wherein the one-way isolation allows for variations at the downstream node to be provided to the upstream node while isolating variations at the upstream node from the downstream node.

4. The apparatus of claim 2, wherein the one-way isolation allows for high-frequency variations at the downstream node to be provided to the upstream node while isolating voltage variations at the upstream node from the downstream node.

5. The apparatus of claim 1, wherein the isolation circuit is selectively enabled to provide high-frequency negative feedback from the downstream node to the upstream node of the amplifying circuit.

6. The apparatus of claim 1, wherein the isolation circuit includes a charge maintenance circuit configured to maintain a charge on a capacitor in the feedback path to reduce capacitor charging and discharging time when the isolation circuit is selectively enabled and disabled.

7. The apparatus of claim 1, further comprising a stabilizing circuit coupled to the downstream node of the amplifying circuit and ground, and configured to prevent oscillation developing in the amplifying circuit by reducing positive high-frequency feedback in the amplifying circuit.

8. A method, comprising:
adjusting an output voltage of an amplifier circuit based at least in part on a feedback signal; and
isolating a downstream node of a feedback path of the amplifier circuit from signals provided at an upstream node of the feedback path.

9. The method of claim 8, further comprising selectively providing high-frequency negative feedback in the amplifier circuit from the downstream node to the upstream node.

10. The method of claim 9, wherein selectively providing high-frequency negative feedback in the amplifier circuit from the downstream node to the upstream node comprises:
enabling the high-frequency negative feedback in the amplifier circuit responsive to an enable signal indicating an active state; and
disabling the high-frequency negative feedback in the amplifier circuit responsive to the enable signal indicating an inactive state.

11. The method of claim 10, further comprising charging or discharging a capacitor included in the high-frequency feedback path while the feedback path is disabled.

12. The method of claim 8, further comprising regulating a magnitude of the output voltage based at least in part on the feedback signal.

13. The method of claim 8, further comprising providing an output voltage using the amplifier circuit based at least in part on a reference voltage.

14. A circuit, comprising:
an amplifier circuit to provide an output voltage based, at least in part, on a feedback signal; and
a feedback path to provide the feedback signal, the feedback path configured to isolate an upstream node of the feedback path from a downstream node of the feedback path, wherein the isolation is in one direction.

15. The circuit of claim 14, wherein the isolation in one direction isolates voltage changes at the upstream node from the downstream node while providing high-frequency feedback from the downstream node to the upstream node.

16. The circuit of claim 14, further comprising a compensation circuit in the feedback path, the compensation circuit configured to provide high-frequency negative feedback to reduce oscillations in the amplifier circuit.

17. The circuit of claim 16, wherein the compensation circuit comprises a capacitive element.

18. The circuit of claim 14, wherein the feedback path comprises an isolation circuit configured to selectively isolate the upstream node of the feedback path from the downstream node of the feedback path responsive to an enable signal, wherein the feedback path provides high-frequency feedback when the isolation circuit is enabled.

19. The circuit of claim 18, wherein the feedback path does not provide high-frequency feedback when the isolation circuit is disabled.

20. The circuit of claim 19, wherein a compensation capacitor included in the feedback path is charged while the isolation circuit is disabled.

* * * * *